US007946858B2

(12) United States Patent
Hsieh

(10) Patent No.: US 7,946,858 B2
(45) Date of Patent: May 24, 2011

(54) ELECTRICAL PLUG AND SOCKET CONNECTOR AND PLUG THEREOF

(75) Inventor: Hung-Yen Hsieh, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/688,845

(22) Filed: Jan. 15, 2010

(65) Prior Publication Data

US 2011/0021086 A1 Jan. 27, 2011

(30) Foreign Application Priority Data

Jul. 23, 2009 (CN) .......................... 2009 1 0304752

(51) Int. Cl.
*H01R 12/00* (2006.01)
*H05K 1/00* (2006.01)

(52) U.S. Cl. ...................................................... 439/76.1

(58) Field of Classification Search ................. 439/76.1, 439/682
See application file for complete search history.

(56) References Cited

U.S. PATENT DOCUMENTS 4,500,774 A * 2/1985 Honjo ........................... 219/265
7,628,655 B1 * 12/2009 Chen ............................ 439/660

FOREIGN PATENT DOCUMENTS

CN 101312284 A 11/2008

* cited by examiner

*Primary Examiner* — Javaid Nasri
(74) *Attorney, Agent, or Firm* — Zhigang Ma

(57) ABSTRACT

An electrical connector includes a socket assembly and a plug assembly. The socket assembly includes a socket. The plug assembly includes a supporting member, a plug, and at least one elastic member. The plug includes a front end capable of inserting into the socket and a back end opposite to the front end. The at least one elastic member is connected between the back end of the plug and the supporting member.

13 Claims, 4 Drawing Sheets

ELECTRICAL PLUG AND SOCKET CONNECTOR AND PLUG THEREOF

BACKGROUND

1. Technical Field

The present disclosure relates to electrical connectors and, particularly, to an electrical connector and a plug thereof capable of adjusting the plugging direction of the plug.

2. Description of Related Art

With the development of communication technology, electrical connectors are widely used for communicating transmissions. Typically, an electrical connector includes a socket and a plug. The socket includes a housing with an insert hole and a number of signal pins received in the housing. The plug can be inserted into the housing through the insert hole to electrically connect with the signal pins received in the housing, thus, the plug can be electrically connected with the socket for communicating transmissions. However, during plugging the plug into the socket, if the plugging direction of the plug is not parallel to the center axis of the insert hole, either the plug or the socket may be damaged.

What is needed, therefore, is an electrical connector and a plug thereof capable of adjusting plugging direction of the plug to overcome or at least mitigate the above-described problem.

BRIEF DESCRIPTION OF THE DRAWINGS

Many aspects of the present electrical connector and plug can be better understood with reference to the accompanying drawings. The components in the drawings are not necessarily drawn to scale, the emphasis instead being placed upon clearly illustrating the principle of the electrical connector and plug. In the drawings, all the views are schematic.

DETAILED DESCRIPTION

Embodiments of the present disclosure will now be described in detail below, with reference to the accompanying drawings.

Figure 1:
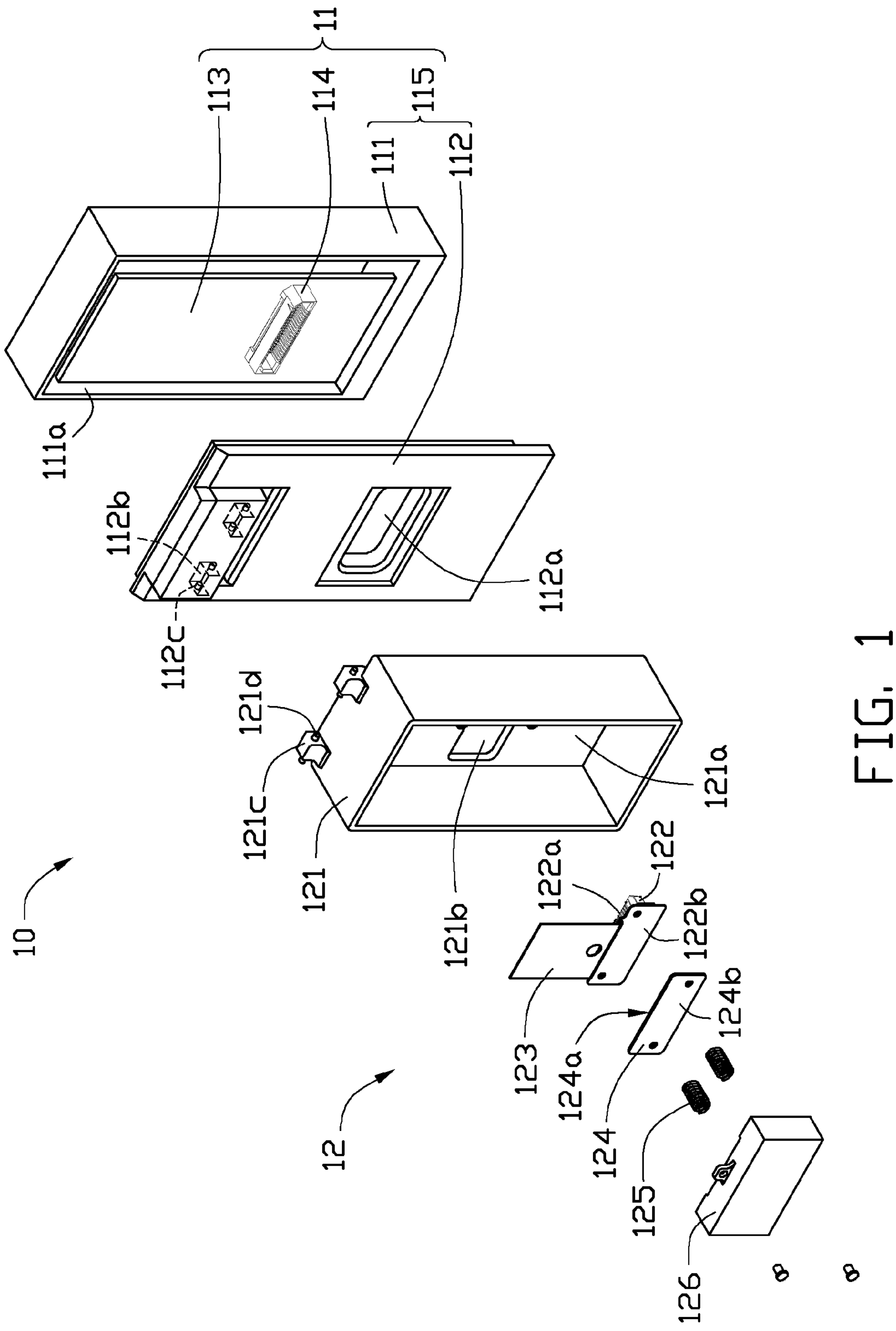
FIG. 1 is an exploded, isometric view of an electrical connector according to an exemplary embodiment.

Referring to FIG. 1, an electrical connector 10, according to an exemplary embodiment, is shown. The electrical connector 10 includes a socket assembly 11 and a plug assembly 12.

The socket assembly 11 includes a first circuit board 113, a socket 114, and a first housing 115. The first housing 115 includes a main body 111 and a cover 112. The main body 111 and the cover 112 cooperatively define a receiving chamber 111*a*. The first circuit board 113 is received in the receiving chamber 111*a*, and the socket 114 is mounted on a surface of the circuit board 113 facing the cover 112. The cover 112 defines a first opening 112*a* corresponding to the socket 114 and two engaging slots 112*b* for engaging with the plug assembly 12.

The plug assembly 12 includes a second housing 121, a plug 122, a second circuit board 123, a reinforcement plate 124, two elastic members 125, and a supporting member 126.

The second housing 121 includes a front wall 121*a* facing the cover 112 of the first housing 111, and two protrusions 121 c corresponding to the two engaging slots 112*b* of the cover 112. The front wall 121*a* defines a second opening 121*b* corresponding to the first opening 112*a*. Each protrusion 121*c* has a pivot shaft 121*d* formed thereon, thus, the second housing 121 can be pivotably connected to the cover 112 of the first housing 115 by the engagement of the two protrusions 121*c* and the two engaging slots 112*b*.

The second circuit board 123, the reinforcement plate 124, the two elastic members 125, and the supporting member 126 are received in the second housing 121. The reinforcement plate 124 includes a first surface 124*a* facing the front wall 121*a* of the second housing 121 and a second surface 124*b* opposite to the first surface 124*a*.

The plug 122 includes a front end 122*a* capable of inserting into the socket 114 and a back end 122*b* opposite to the front end 122*a*. The back end 122*b* of the plug 122 is fixed to the first surface 124*a* of the reinforcement plate 124, and the front end 122*a* of the plug 122 extends out of the second housing 121 from the second opening 121*b*. The second opening 121*b* is bigger than the front end 122*a* of the plug 122. The plug 122 is movable relative to the second housing 121.

The second circuit board 123 is electrically connected to the plug 122 and an end of the second circuit board 123 connecting to the plug 122 is movable together with the plug 122. In the present embodiment, the second circuit board 123 is a flexible circuit board.

Each of the two elastic members 125 has one end connected to the second surface 124*b* of the reinforcement plate 124, and the other end connected to the supporting member 126. In the present embodiment, the two elastic members 125 are springs. It should be understood that the number of the elastic members 125 is not limited to this embodiment. The number of the elastic members 125 can also be one, three, etc.

Figure 2:
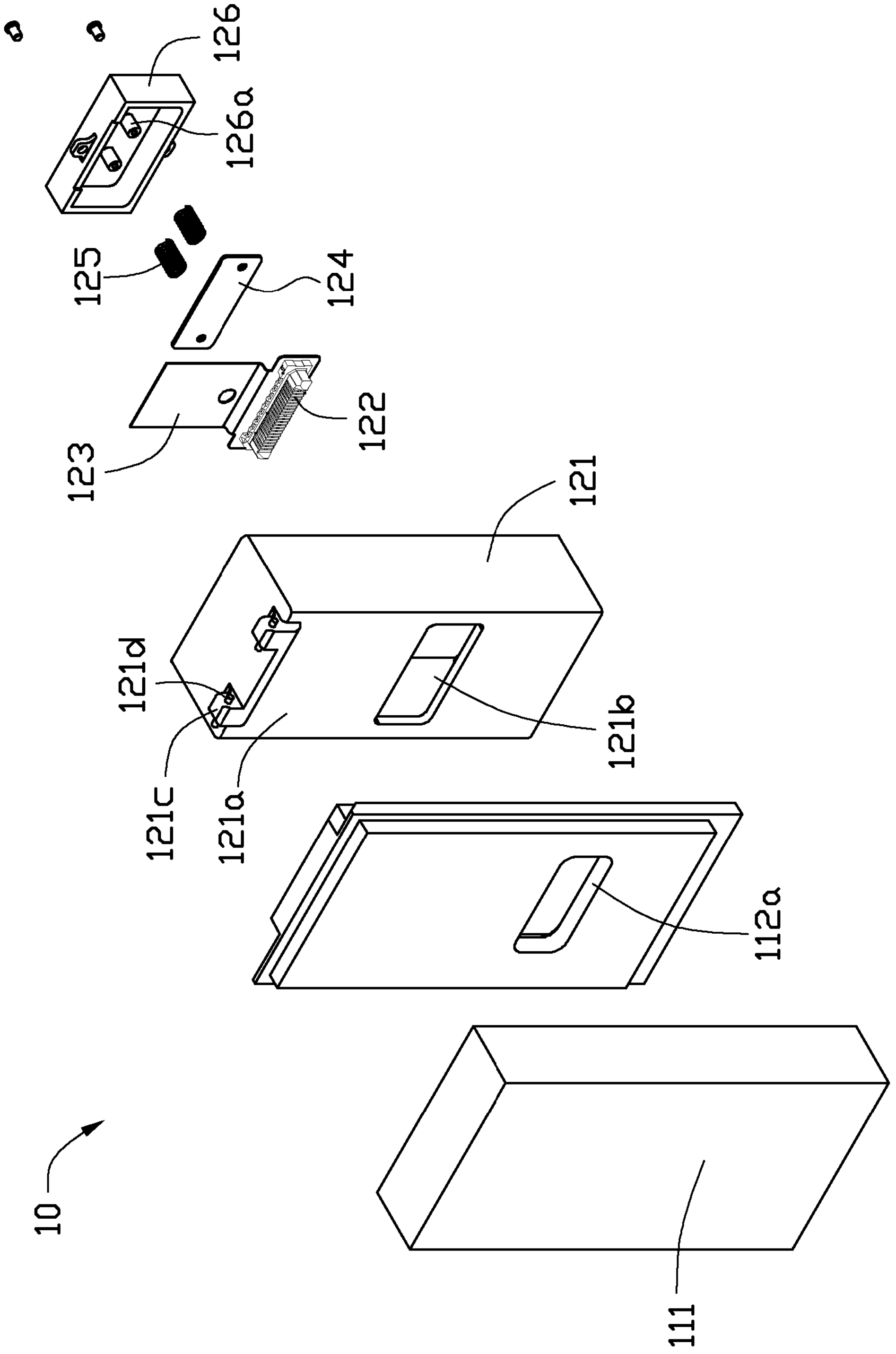
FIG. 2 is an exploded, isometric view of the electrical connector of FIG. 1, viewed from an opposite side.

The supporting member 126 is fixed to the second housing 121 for supporting the reinforcement plate 124 and the plug 122 through the two elastic members 125. Further referring to FIG. 2, the supporting member 126 includes two positioning posts 126*a* extending towards the reinforcement plate 124. The two elastic members 125 sleeve the two positioning posts 126*a* respectively.

In the present embodiment, the plug 122 and the socket 114 are used for communicating signals between the first circuit board 113 and the second circuit board 123. In other embodiments, signal lines could also replace the first circuit board 113 and the second circuit board 123.

Figure 3:
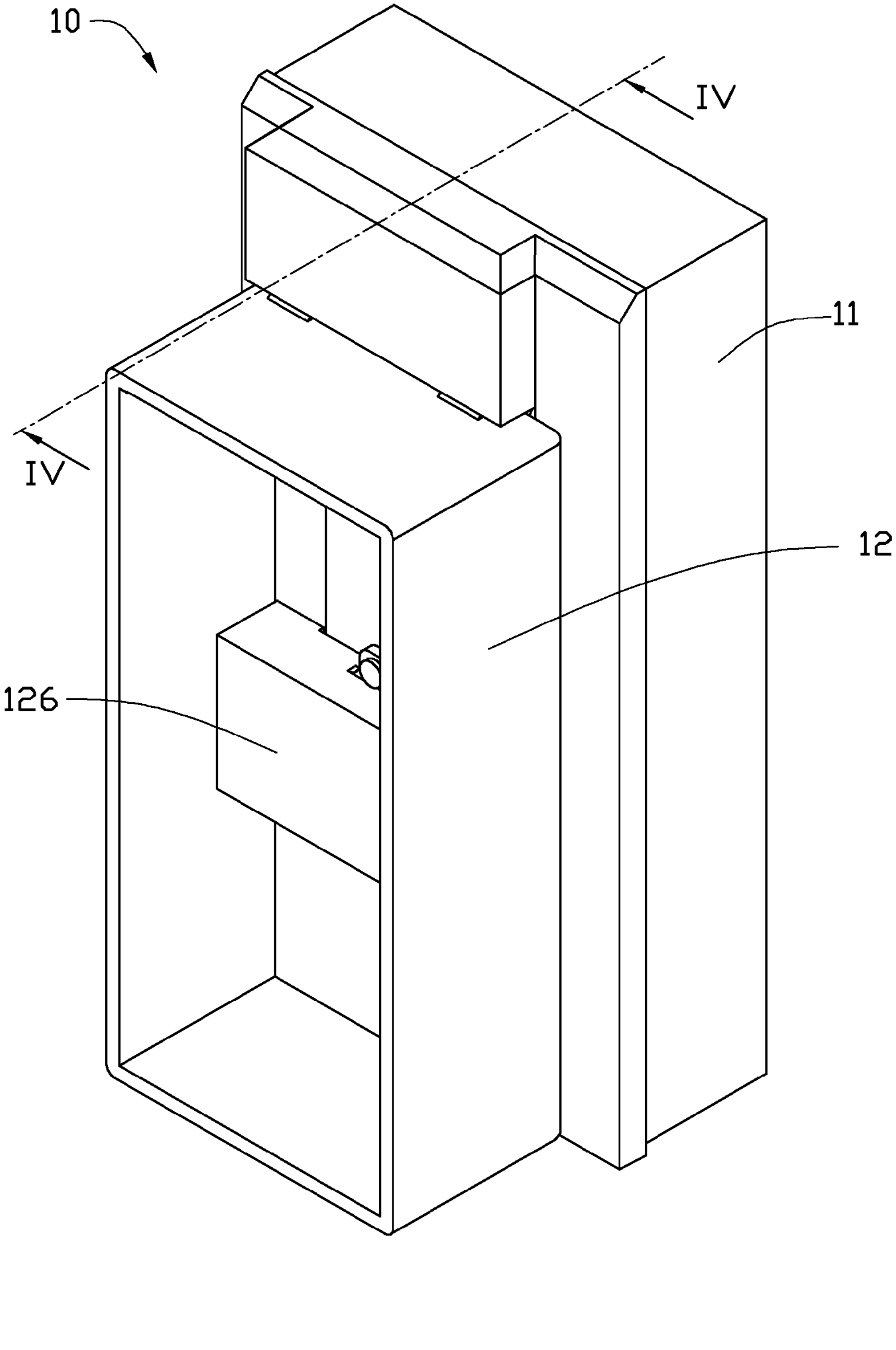
FIG. 3 is an assembled, isometric view of the electrical connector of FIG. 1.
Figure 4:
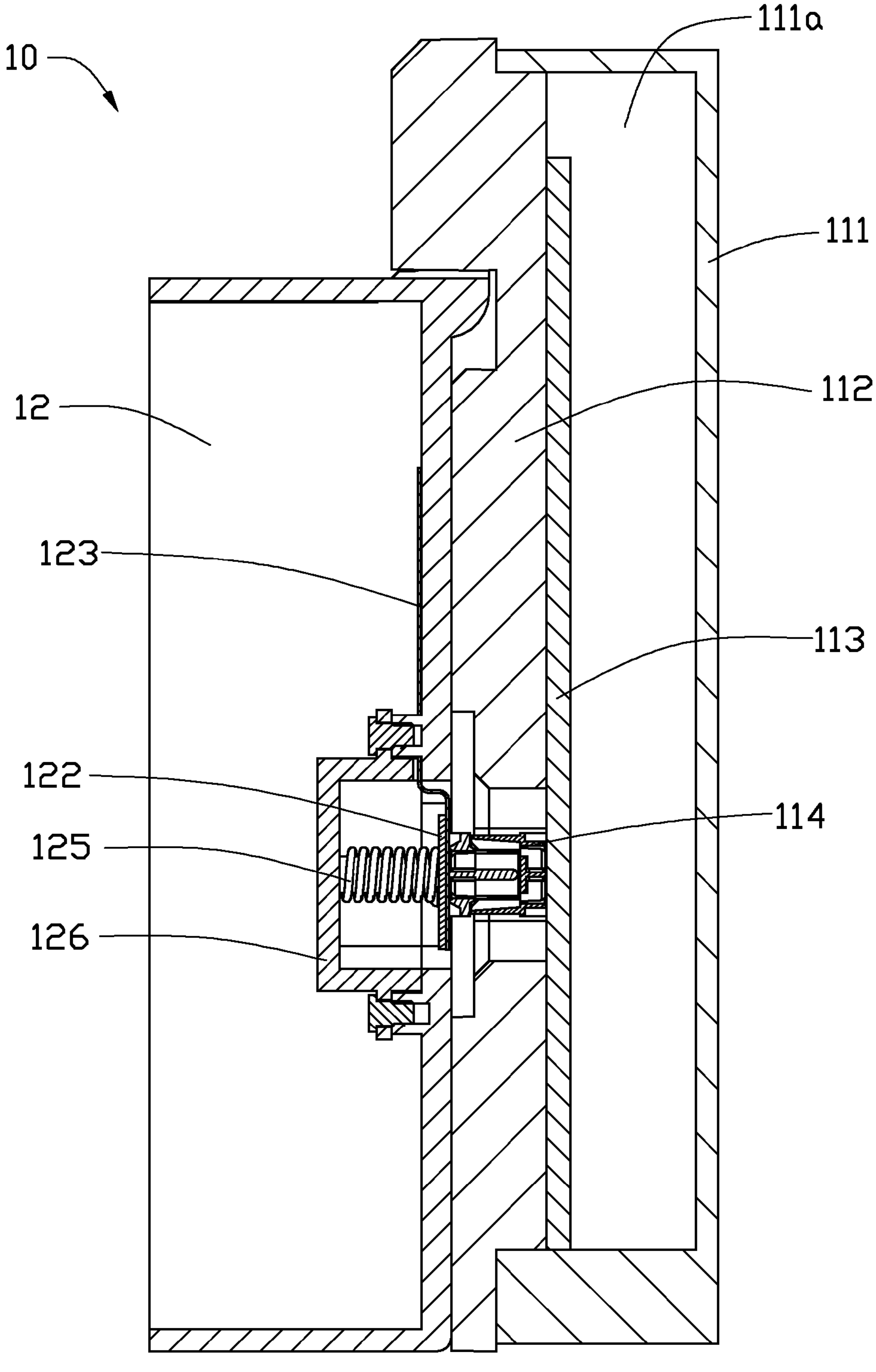
FIG. 4 is cross sectional view of the electrical connector taken along line IV-IV of FIG. 3.

Further referring to FIGS. 3 and 4, when the plug assembly 12 is oriented to connect with the socket assembly 11, the two elastic members 125 can be deformed to adjust the plugging direction of the plug 122 and buffer the plugging force applied on the plug assembly 12, therefore, both of the plug 122 and the socket 114 can be protected properly during the plug 122 inserting into the socket 114.

While certain embodiments have been described and exemplified above, various other embodiments will be apparent to those skilled in the art from the foregoing disclosure. The invention is not limited to the particular embodiments described and exemplified, and the embodiments are capable of considerable variation and modification without departure from the scope and spirit of the appended claims.

What is claimed is:

1. An electrical connector comprising:

a socket assembly comprising:

a socket; and a first housing receiving the socket and defining a first opening corresponding to the socket; and a plug assembly comprising:

a supporting member;

a plug comprising a front end capable of inserting into the socket and a back end opposite to the front end;

at least one elastic member connected between the back end of the plug and the supporting member; and a second housing pivotably connected to the first housing, wherein the second housing receives the supporting member and the at least one elastic member, and the front end of the plug extends out of the second housing from a second opening defined on the second housing.

2. The electrical connector as claimed in claim 1, wherein the plug assembly further comprises a reinforcement plate, the reinforcement plate comprises a first surface and a second surface opposite to the first surface, the back end of the plug is fixed to the first surface of the reinforcement plate, and the at least one elastic member each has one end connected to the second surface of the reinforcement plate and the other end connected to the supporting member.

3. The electrical connector as claimed in claim 1, wherein the at least one elastic member each is a spring.

4. The electrical connector as claimed in claim 3, wherein the supporting member comprises at least one positioning post extending towards the plug, and the at least one elastic member each sleeves one of the at least one positioning post.

5. The electrical connector as claimed in claim 1, wherein the socket assembly further comprises a circuit board electrically connected to the socket.

6. The electrical connector as claimed in claim 1, wherein the plug assembly further comprises a circuit board electrically connected to the plug.

7. The electrical connector as claimed in claim 6, wherein the circuit board is a flexible circuit board.

8. A plug assembly of an electrical connector comprising:

a supporting member;

a plug comprising a front end capable of inserting into a socket of the electrical connector and a back end opposite to the front end;

at least one elastic member connected between the back end of the plug and the supporting member; and a housing configured for pivotably connected to a socket assembly of the electrical connector, wherein the housing receives the supporting member and the at least one elastic member, and the front end of the plug extends out of the housing from an opening defined on the housing.

9. The electrical connector as claimed in claim 8, wherein the plug assembly further comprises a reinforcement plate, the reinforcement plate comprises a first surface and a second surface opposite to the first surface, the back end of the plug is fixed to the first surface of the reinforcement plate, and the at least one elastic member each has one end connected to the second surface of the reinforcement plate and the other end connected to the supporting member.

10. The electrical connector as claimed in claim 8, wherein the at least one elastic member each is a spring.

11. The electrical connector as claimed in claim 10, wherein the supporting member comprises at least one positioning post extending towards the plug, and the at least one elastic member each sleeves one of the at least one positioning post.

12. The electrical connector as claimed in claim 8, wherein the plug assembly further comprises a circuit board electrically connected to the plug.

13. The electrical connector as claimed in claim 12, wherein the circuit board is a flexible circuit board.

* * * * *